US012603145B2

(12) United States Patent
Lee et al.

(10) Patent No.: US 12,603,145 B2
(45) Date of Patent: Apr. 14, 2026

(54) SYSTEM AND METHOD FOR EXTENDING LIFETIME OF MEMORY DEVICE

(71) Applicant: Taiwan Semiconductor Manufacturing Company Limited, Hsinchu (TW)

(72) Inventors: Yung-Huei Lee, New Taipei (TW); Pei-Chun Liao, Hsinchu County (TW); Jian-Hong Lin, Yunlin (TW); Dawei Heh, Hsinchu (TW); Wen Hsien Kuo, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 57 days.

(21) Appl. No.: 18/625,895

(22) Filed: Apr. 3, 2024

(65) Prior Publication Data

US 2024/0249792 A1     Jul. 25, 2024

Related U.S. Application Data

(63) Continuation of application No. 17/370,763, filed on Jul. 8, 2021, now Pat. No. 11,972,826.

(51) Int. Cl.
G11C 29/44 (2006.01)
G11C 13/00 (2006.01)

(52) U.S. Cl.
CPC ...... G11C 29/4401 (2013.01); G11C 13/0004 (2013.01); G11C 13/0069 (2013.01)

(58) Field of Classification Search
CPC ............ G11C 29/4401; G11C 13/0004; G11C 13/0069; G11C 29/12005; G11C 29/38;
(Continued)

(56) References Cited

U.S. PATENT DOCUMENTS

| 11,972,826 B2 * | 4/2024 | Lee ..................... G11C 13/0035 |
| 2008/0117663 A1 | 5/2008 | Philipp et al. |

(Continued)

OTHER PUBLICATIONS

Non-Final Office Action on U.S. Appl. No. 17/370,763 dtd Aug. 30, 2023.

(Continued)

*Primary Examiner* — Jay W. Radke
(74) *Attorney, Agent, or Firm* — Foley & Lardner LLP

(57) ABSTRACT

A method of extending a lifetime of a memory cell is provided. The method includes detecting, by a memory controller, whether a memory cell has failed or not; repairing, by the memory controller, the memory cell by applying a first pulse having a first amplitude to the memory cell, in response to determining that the memory cell has failed; and writing, by the memory controller, input data to the memory cell by applying a second pulse having a second amplitude less than the first amplitude, in response to repairing the memory cell. In one expect, the detecting includes writing, by the memory controller, additional input data to the memory cell; reading, by the memory controller, data stored by the memory cell; comparing, by the memory controller, the data stored by the memory cell with the additional input data; and determining whether the memory cell has failed according to the comparison.

20 Claims, 13 Drawing Sheets

<u>800</u>

(58) Field of Classification Search
CPC ............ G11C 13/0026; G11C 13/0035; G11C
2013/009; G11C 2013/0092; G11C
2213/79; G11C 13/0033
See application file for complete search history.

(56)                       References Cited

U.S. PATENT DOCUMENTS

| | | |
|---|---|---|
| 2011/0051507 A1 | 3/2011 | Sarkar et al. |
| 2011/0078538 A1 | 3/2011 | Ikegawa et al. |
| 2020/0013459 A1 | 1/2020 | Do et al. |
| 2023/0395114 A1* | 12/2023 | Visconti ................. G11C 29/50 |

OTHER PUBLICATIONS

Notice of Allowance on U.S. Appl. No. 17/370,763 dtd Dec. 28, 2023.

* cited by examiner

|  | SET | RESET | Read |
|---|---|---|---|
| $V_{WL}$ | 1.1V | 1.8V | 1.1V |
| $V_{BL}$ | 2.0V | 2.0V | 0.1V |
| $V_{WL}$ | 400ns | 100ns | DC |
| $V_{BL}$ | 800ns | 200ns | DC |

1T1R configuration

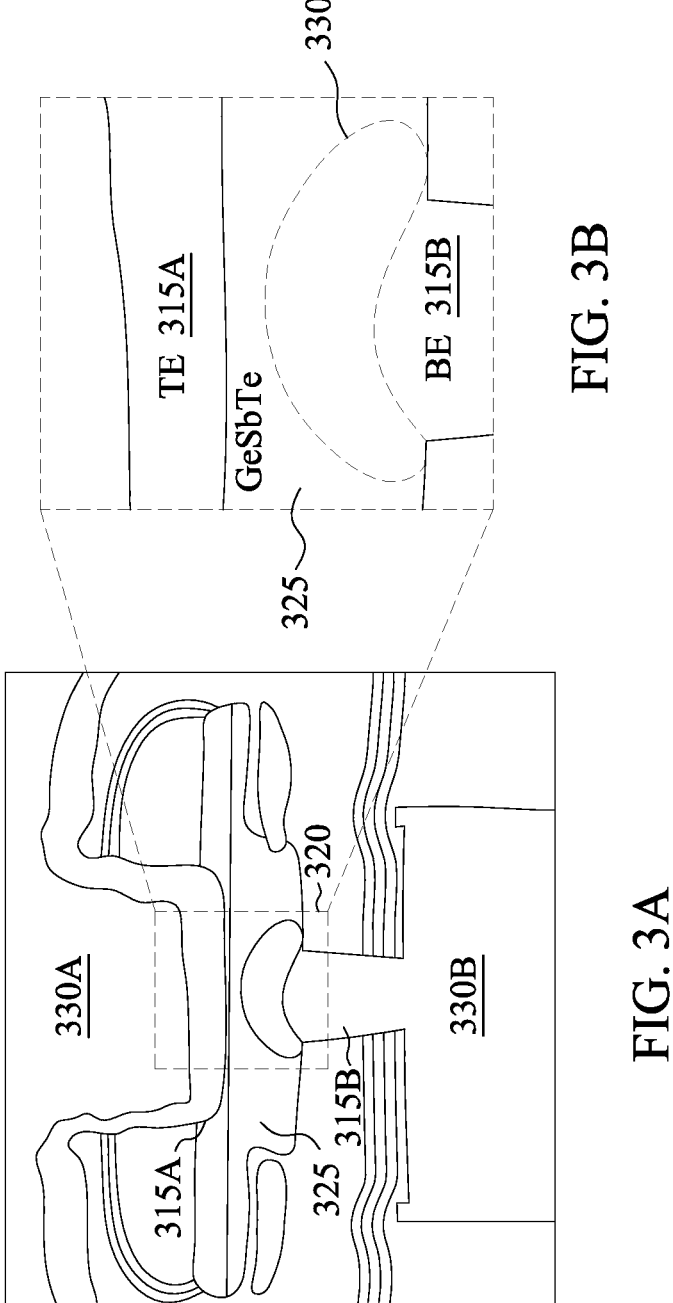
FIG. 3B
FIG. 3A

900

1050

1000

SYSTEM AND METHOD FOR EXTENDING LIFETIME OF MEMORY DEVICE

CROSS-REFERENCE TO RELATED APPLICATION

This application is a continuation application of U.S. Utility application Ser. No. 17/370,763, filed Jul. 8, 2021, titled "SYSTEM AND METHOD FOR EXTENDING LIFETIME OF MEMORY DEVICE," the entire contents of which are incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a cross section diagram of a phase change random access memory (PCRAM) device in a normal operating condition, in accordance with some embodiments.

FIG. 3B is a zoom-in diagram of a portion of the cross-section diagram of FIG. 3A, in accordance with some embodiments.

DETAILED DESCRIPTION

Figure 1:
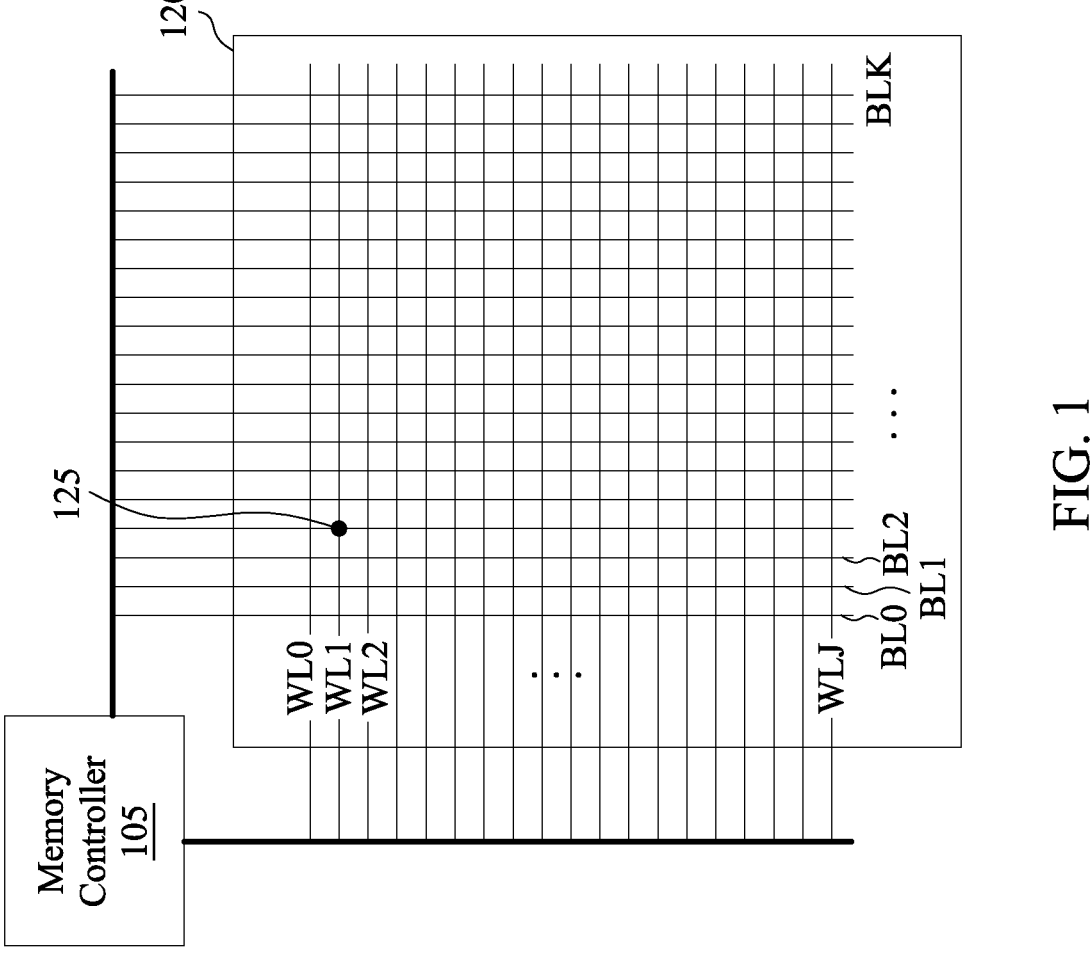
FIG. 1 is a diagram of a memory system, in accordance with one embodiment.
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a system and a method of extending a lifetime of a memory cell. In one aspect, a memory controller applies a first pulse having a first amplitude or a first voltage to the memory cell to write input data to the memory cell. In one aspect, the memory controller applies a second pulse having a second amplitude or second voltage to extend a lifetime of the memory cell. In one aspect, a magnitude of the second amplitude is larger than a magnitude of the first amplitude.

In one aspect, the memory cell includes a resistive memory device (e.g., a phase change random access memory (PCRAM), resistive random access memory (ReRAM), Magnetoresistive random-access memory (MRAM), etc.). A memory controller may set or configure a resistance of a resistive memory device to store data. For example, the memory controller may apply a first write pulse or a first write voltage to the resistive memory device such that the resistive memory device has a low resistance lower than a threshold resistance to represent logic '0'. Similarly, the memory controller may apply a second write pulse or a second write voltage to the resistive memory device such that the resistive memory device has a high resistance higher than the threshold resistance to represent logic '1'. In one aspect, the resistive memory device can retain its resistance without power, hence may operate as a non-volatile memory device.

Despite the advantages of the resistive memory device, the resistive memory device may fail after a large number of write operations. For example, after performing over a billion write operations on the resistive memory, porous areas within the resistive memory device may be formed. Due to porous areas, the resistive memory device may become nonresponsive to the first write voltage and the second write voltage, such that a resistance of the resistive memory device may not change despite the first write voltage or the second write voltage applied.

In one aspect, the memory controller disclosed herein may apply a recovery voltage or a recovery pulse to a resistive memory device to extend a lifetime of the resistive memory device. The recovery voltage may have a higher voltage than the first write voltage and the second write voltage. By applying the recovery voltage or a recovery pulse having a higher amplitude than the first write pulse and the second write pulse, porous areas may be reduced or materials within the resistive memory device may be oriented, such that a resistance of the resistive memory device can be changed according to the first write voltage or the second write voltage.

In one aspect, the memory controller can apply a recovery voltage or a recovery pulse to a memory device as a corrective approach, a preventive approach, or both. As a corrective approach, the memory controller applies the recovery voltage or the recovery pulse to a failed resistive memory device. For example, the memory controller detects a failed resistive memory device, and applies the recovery voltage or the recovery pulse to the failed resistive memory device to repair the failed resistive memory device. As a preventive approach, the memory controller periodically applies the recovery voltage or the recovery pulse to a resistive memory device to extend a lifetime of the resistive memory device. For example, the memory controller counts a number of write operations performed on a resistive memory device, and applies the recovery voltage or the recovery pulse to the resistive memory device when the counted number reaches a predetermined threshold (e.g., every thousand write operation). By applying the recovery voltage or the recovery pulse to a memory device as a corrective approach, a preventive approach, or both, a lifetime of the memory device can be extended.

Although various embodiments disclosed herein are described with respect to a memory cell including a PCRAM device, different resistive memory devices (e.g., magnetic tunneling junction device) or different memory devices may be implemented in some embodiments.

FIG. 1 is a diagram of a memory system 100, in accordance with one embodiment. In some embodiments, the memory system 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory system 100 includes more, fewer, or different components than shown in FIG. 1.

In some embodiments, the memory array 120 is a hardware component that stores data. In one aspect, the memory array 120 is embodied as a semiconductor memory device.

The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive traces or metal rails. In one aspect, each memory cell 125 is coupled to a corresponding word line WL and a corresponding bit line, and can be operated according to voltages or currents through the corresponding word line WL and the corresponding bit line BL. In one aspect, each memory cell 125 includes one or more resistive memory devices (e.g., one or more PCRAM devices). The memory cell 125 may be non-volatile memory that stores or retains data without power. In some embodiments, the memory array 120 includes additional lines (e.g., select lines, reference lines, reference control lines, power rails, source lines, etc.).

In some embodiments, the memory controller 105 is a hardware component that controls operations of the memory array 120. Examples of operations performed include writing data at a memory cell 125, reading data from a memory cell 125, etc. To write data at a memory cell 125, the memory controller 105 may provide voltages, currents, and/or pulses to a word line coupled to the memory cell 125 and a bit line coupled to the memory cell 125. To read data from a memory cell 125, the memory controller 105 may provide a voltage, current, and/or pulse to the word line coupled to the memory cell 125, and sense a voltage or current through the bit line or a source line coupled to the memory cell 125.

In some embodiments, the memory controller 105 may perform operations to extend a lifetime of a memory cell. In some embodiments, the memory controller 105 may perform a corrective operation to repair a failed memory cell 125, a preventive operation to prevent a memory cell 125 from failing, or a combination of them. A resistive memory cell may fail after a large number of write operations (e.g., over a billion write operations) performed on the resistive memory cell. For example, after a large number of write operations, porous areas can be formed within a memory cell. Such porous areas may cause the memory cell to be non-responsive to voltage, current, or a pulse applied for writing data. In one approach, the memory controller 105 detects whether a memory cell has failed or not, and performs a corrective operation to repair the failed memory cell. In one approach, the memory controller 105 periodically performs a preventive operation to prevent a memory cell from failing. To repair a failed memory cell 125 and/or prevent a memory cell 125 from failing, the memory controller 105 may apply a recovery pulse to the memory cell 125. In one aspect, the recovery pulse has a voltage or an amplitude larger than a voltage or an amplitude of the pulse for writing data. By applying the recovery pulse with higher voltages or amplitudes, stress can be applied to the memory cell 125. Due to the stress applied to the memory cell 125, materials within the memory cell 125 may be configured or oriented in a manner that porous areas within the memory device may be reduced. Accordingly, the memory cell 125 can become more responsive to the pulse for writing data. Detailed descriptions on configurations and operations of memory system 100 are provided below with respect to FIGS. 2 through 9 and FIGS. 10A and 10B.

Figure 2:
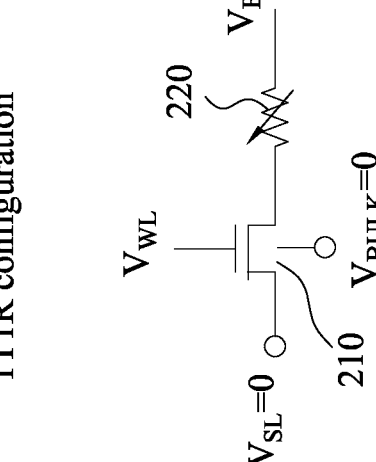
FIG. 2 is a schematic diagram of a memory cell including a resistive memory device and example voltages applied for different operations of the memory cell, in accordance with some embodiments.
Figure 2:

FIG. 2 is a schematic diagram of the memory cell 125 and example voltages applied for different operations of the memory cell 125, in accordance with some embodiments. In some embodiments, the memory cell 125 includes a pass transistor 210 and a resistive memory device 220. In some embodiments, the transistor 210 is embodied as a metal-oxide-semiconductor field-effect transistor (MOSFET), fin field-effect transistor (FinFET), or any transistor. The transistor 210 may be N-type transistor or P-type transistor. In some embodiments, the resistive memory device 220 is embodied as a PCRAM device. The transistor 210 and the resistive memory device 220 may operate together to store data according to voltage, current, or pulse applied by the memory controller 105. In some embodiments, the memory cell 125 includes more, fewer, or different components than shown in FIG. 2.

In one configuration, the pass transistor 210 and the resistive memory device 220 are coupled to each other in series. In one aspect, the transistor 210 includes a first electrode (e.g., source electrode) coupled to a source line (e.g., having voltage $V_{SL}$), a second electrode (e.g., gate electrode) coupled to a word line (e.g., having voltage $V_{WL}$), and a third electrode coupled to a first electrode of the resistive memory device 220. In one aspect, the resistive memory device 220 includes a second electrode coupled to a bit line (e.g., having voltage $V_{BL}$) A substrate electrode of the transistor 210 receives voltage $V_{BULK}$.

In this configuration, the memory controller 105 can apply various voltages or pulses to a memory cell 125 through a word line, a bit line, and a source line to write data to the resistive memory device 220 or read data stored by the resistive memory device 220. In one approach, the memory controller 105 can set a resistance of the resistive memory device 220 by applying a first write voltage to the word line for a first time period and a first bit line voltage to the bit line for a second time period. For example, to set a resistance of the resistive memory device 220 to have a first state (e.g., logic '1'), the memory controller 105 may apply 1.1V to the word line for 400 ns and apply 2.0V to the bit line for 800 ns. In one approach, the memory controller 105 can reset the resistance of the resistive memory device 220 by applying a second write voltage to the word line for a third time period and the first bit line voltage to the bit line for a fourth time period. For example, to reset the resistance of the resistive memory device 220 to have a second state (e.g., logic '0'), the memory controller 105 may apply 1.8V to the word line for 100 ns and apply 2.0V to the bit line for 200 ns. In one approach, the memory controller 105 can read the resistance stored by the resistive memory device 220 by applying a read voltage to the word line and a second bit line voltage to the bit line. For example, to read the resistance stored by the resistive memory device 220, the memory controller 105 may apply 1.1V to the word line and apply 0.1V to the bit line.

FIG. 3A is a cross section diagram 310 of a PCRAM device, in accordance with some embodiments. FIG. 3B is a zoom-in diagram of a portion 320 of the cross section diagram 310, in accordance with some embodiments. The PCRAM device may be the resistive memory device 220 of FIG. 2. In some embodiments, the PCRAM device includes a top electrode (TE) 315A and a bottom electrode (BE) 315B. The PCRAM device may also include phase change materials 325 (e.g., GeSbTe) between the TE 315A and the BE 315B. The TE 315A may be connected to a contact 330A including conductive materials, and the BE 315B may be connected to a contact 330B including conductive materials. Through the contacts 330A, 330B, voltage or current can be applied to the TE 315A and the BE 315B. The phase change materials 325 may change configuration or orientation according to a voltage, current, or a pulse applied across the TE 315A and the BE 315B. By changing the configuration or the orientation of the phase change materials 325, the resistance of the PCRAM device 310 can be SET or RESET.

In one aspect, after a large number of write operations (e.g., over one billion write operations) performed on the PCRAM device, one or more porous areas 330 can be formed within the phase change materials 325. Due to the porous area 330, the PCRAM device may become nonresponsive to a write voltage or a write pulse, such that a resistance of the PCRAM device 310 may not change.

Figure 4:
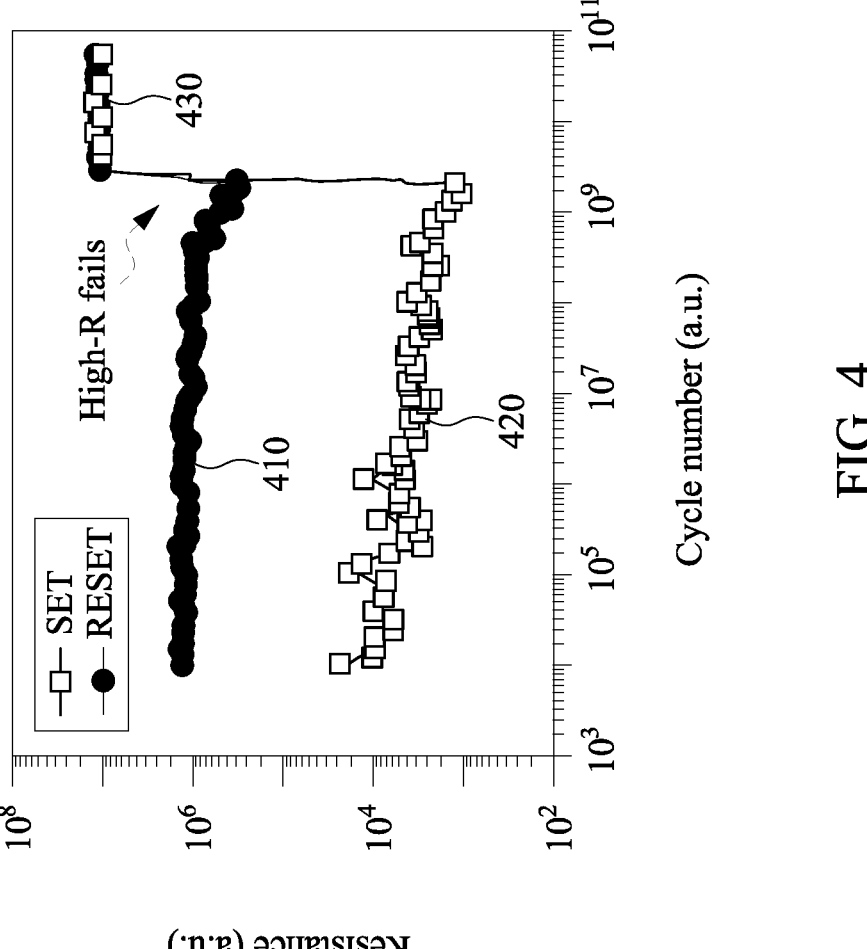
FIG. 4 is a plot showing a failure of a resistive memory device after a number of write operations, in accordance with some embodiments.
Figure 4:

FIG. 4 is a plot 400 showing a failure of the resistive memory device 220 after a number of write operations, in accordance with some embodiments. When the resistive memory device 220 operates in a normal condition without a failure, the resistive memory device 220 can be SET to have a first resistance 420 or RESET to have a second resistance 410 according to a voltage, current, or a pulse applied to the resistive memory device 220. However, after a large number of write operations (e.g., over a billion write operations), the resistive memory device 220 may have a fixed resistance 430 and become non-responsive to a voltage, current, or a pulse for writing data. For example, as described above with respect to FIGS. 3A and 3B, the resistive memory device 220 may have porous areas that prevent the resistance of the resistive memory device 220 from changing despite the voltage, current or pulse for writing data.

Figure 5:
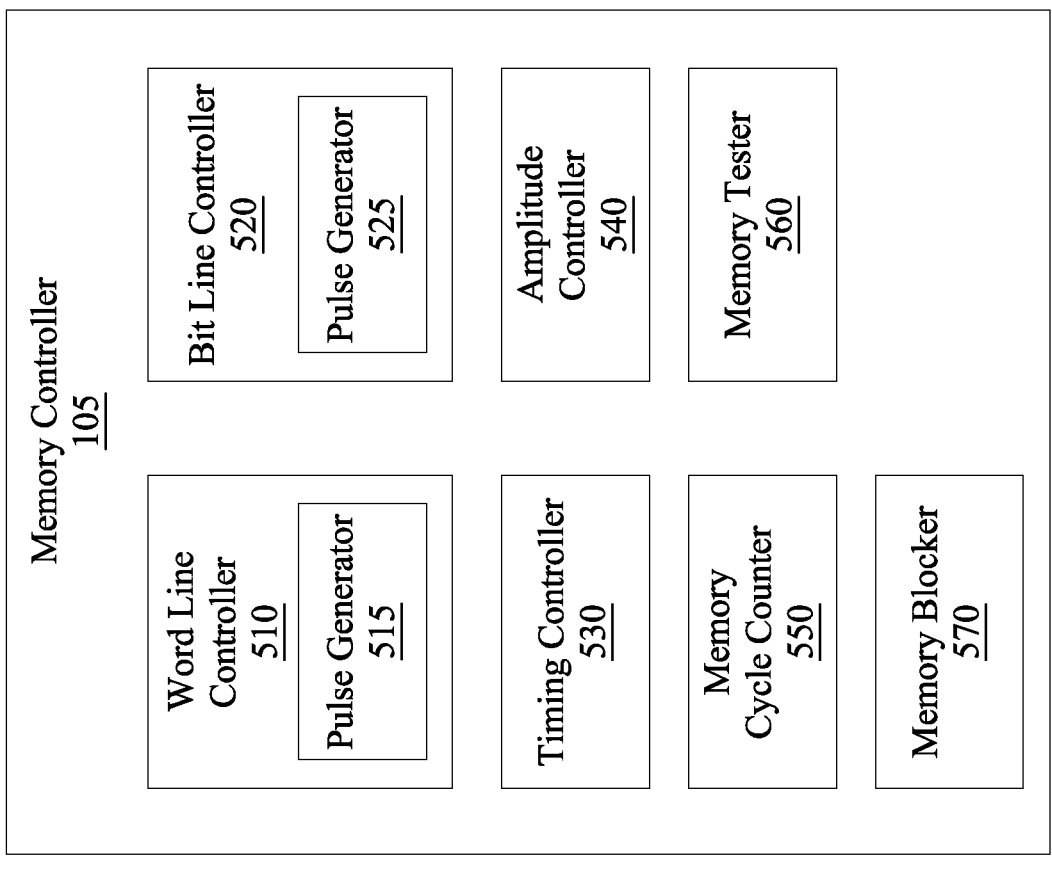
FIG. 5 is a block diagram of a memory controller, in accordance with one embodiment.

FIG. 5 is a block diagram of the memory controller 105, in accordance with one embodiment. In some embodiments, the memory controller 105 includes a word line controller 510, a bit line controller 520, a timing controller 530, an amplitude controller 540, a memory cycle counter 550, a memory tester 560, and a memory blocker 570. These components may operate together to write data at a memory cell 125. These components may be embodied as digital logic circuits, application specific integrated circuit (ASIC), or a combination of them. In some embodiments, the memory controller 105 includes more, fewer, or different components than shown in FIG. 5.

In some embodiments, the timing controller 530 is a circuit that synchronizes operations of the word line controller 510, the bit line controller 520, the amplitude controller 540, the memory cycle counter 550, the memory tester 560, the memory blocker 570, or any combination of them. In one configuration, the timing controller 530 is coupled to the word line controller 510, the bit line controller 520, the amplitude controller 540, the memory cycle counter 550, the memory tester 560, the memory blocker 570, or any combination of them through conducive traces or metal rails. In this configuration, the timing controller 530 may generate control signals or clock signals, and provide the control signals or the clock signals to the word line controller 510, the bit line controller 520, the amplitude controller 540, the memory cycle counter 550, the memory tester 560, the memory blocker 570, or any combination of them. In some embodiments, the timing controller 530 is replaced by a different component that performs the similar functionalities of the timing controller 530 described herein. According to the control signals or the clock signals, the word line controller 510, the bit line controller 520, the amplitude controller 540, the memory cycle counter 550, the memory tester 560, and/or the memory blocker 570 can perform various operations (e.g., writing data, reading data, detecting a failed memory cell 125, repairing the failed memory cell 125, preventing a memory cell 125 from failing, etc.) in a synchronous manner.

In some embodiments, the word line controller 510 includes a pulse generator 515 that provides a voltage or a current through one or more word lines WL of the memory array 120. In some embodiments, the bit line controller 520 includes a pulse generator 525 that provides a voltage or current through one or more bit lines BL of the memory array 120. The pulse generator 515 of the word line controller 510 may be coupled to word lines WL of the memory array 120, and the pulse generator 525 of the bit line controller 520 may be coupled to bit lines BL of the memory array 120. In this configuration, the pulse generator 515 of the word line controller 510 may generate a pulse corresponding to an operation to perform and provide the pulse to a word line coupled to a memory cell 125. Similarly, the pulse generator 525 of the bit line controller 520 may generate a pulse corresponding to an operation to perform and provide the pulse to a bit line coupled to the memory cell 125. Each of the pulse generators 515, 525 may include or be embodied as a voltage boost converter, a low-dropout regulator (LDO), charge pump, etc. In some embodiments, the bit line controller 520 includes a sensor or a sense amplifier that senses a voltage or current at a memory cell 125 through a bit line or a source line, and determines data stored by the memory cell 125 according to the sensed voltage or current. In some embodiments, the word line controller 510 and the bit line controller 520 are replaced by different components that perform the similar functionalities of the word line controller 510 and the bit line controller 520 described herein.

In some embodiments, the amplitude controller 540 is a component that selects voltages, currents, or amplitudes of pulses generated by the pulse generators 515, 525. The amplitude controller 540 may be coupled to the pulse generators 515, 525 through conductive traces or metal rails. In this configuration, the amplitude controller 540 determines an operation to perform, and selects voltages, currents, or amplitudes of pulses according to the operation to perform. In one approach, the amplitude controller 540 selects different amplitudes for writing a first state (e.g., logic '1'), writing a second state (e.g., logic '0'), and repairing a failed memory cell 125 or preventing a memory cell 125 from failing. The amplitude controller 540 may generate instructions or signals corresponding to the selected amplitudes and provide the instructions or signals to the respective pulse generators 515, 525. According to the instructions or signals from the amplitude controller 540, the pulse generators 515, 525 may generate pulses having selected amplitudes. In some embodiments, the amplitude controller 540 and the pulse generators 515, 525 are integrated as a single component. In some embodiments, the amplitude controller 540 is replaced by a different component that performs the similar functionalities of the amplitude controller 540 described herein.

In some embodiments, the memory cycle counter 550 is a component that counts a number of operations performed on a memory cell 125. The memory cycle counter 550 may be coupled to the word line controller 510 and/or the bit line controller 520 through conductive traces or metal rails. In this configuration, the memory cycle counter 550 may count a number of write operation cycles performed on the memory cell 125. In one approach, the memory cycle counter 550 may count, for each memory cell 125, a corresponding number of write operations performed. In one approach, the memory cycle counter 550 may count, for a group of memory cells 125, an average number of write operations performed. In some embodiments, the memory cycle counter 550 is replaced by a different component that performs the similar functionalities of the memory cycle counter 550 described herein.

In some embodiments, the memory tester 560 is a component that detects a failed memory cell 125. The memory tester 560 may be coupled to the word line controller 510 and the bit line controller 520 through conductive traces or metal rails. In this configuration, the memory tester 560 may determine whether the memory cell 125 has failed or not. In one approach, the memory tester 560 obtains input data provided to the word line controller 510 for writing at a memory cell 125, and obtains data stored by the memory cell 125 from the bit line controller 520. The memory tester 560 can compare the input data and the data stored by the memory cell 125. In response to determining that the input data and the stored data being different, the memory tester 560 may determine that the memory cell 125 has failed. In response to determining that the input data and the stored data being equal to each other, the memory tester 560 may determine that the memory cell 125 has not failed. In some embodiments, the memory tester 560, the word line controller 510, and the bit line controller 520 are integrated as a single component. In some embodiments, the memory tester 560 is replaced by a different component that performs the similar functionalities of the memory tester 560 described herein.

In some embodiments, the memory blocker 570 is a component that blocks a failed memory cell 125. In one configuration, the memory blocker 570 is coupled to the memory tester 560 through conductive traces or metal rails. In this configuration, the memory blocker 570 may determine whether the memory cell 125 has failed, even after a recovery operation is performed. In response to determining that the memory cell 125 has not failed after the recovery operation is performed, the memory blocker 570 may not block the memory cell 125. In response to determining that the memory cell 125 has failed even after the recovery operation is performed, the memory blocker 570 may determine that the memory cell 125 is irreparable and may block the memory cell 125. The blocked memory cell 125 may be precluded from storing data. In one approach, the memory blocker 570 stores addresses of blocked memory cells 125. In some embodiments, the memory blocker 570 is replaced by a different component that performs the similar functionalities of the memory blocker 570 described herein.

In one example, to write input data logic '1' to a memory cell 125, the amplitude controller 540 may select a first write voltage (e.g., 1.1V) for the word line and may select a first bit line voltage (e.g., 2.0V) for the bit line. According to the selected voltages or amplitudes, the pulse generator 515 of the word line controller 510 may provide the first write voltage to the memory cell 125 through the word line coupled to the memory cell 125, and provide the first bit line voltage to the memory cell 125 through the bit line coupled to the memory cell 125.

In one example, to write input data logic '0' to a memory cell 125, the amplitude controller 540 may select a second write voltage (e.g., 1.8V) for the word line and may select the first bit line voltage (e.g., 2.0V) for the bit line. According to the selected amplitudes, the pulse generator 515 of the word line controller 510 may provide the second write voltage to the memory cell 125 through the word line WL, and provide the first bit line voltage to the memory cell 125 through the bit line BL.

In one example, to read data stored by the memory cell 125, the amplitude controller 540 may select a read voltage (e.g., 1.1V) for the word line and may select a second bit line voltage (e.g., 0.1V) for the bit line. According to the selected amplitudes, the pulse generator 515 of the word line controller 510 may provide the read voltage to the memory cell

125 through the word line WL, and provide the second bit line voltage to the memory cell 125 through the bit line BL. In some embodiments, the bit line controller 520 can sense a voltage or current through the bit line or through the source line, and determine data stored by the memory cell 125 according to the sensed voltage or current.

In one example, to perform corrective operation to repair a failed memory cell, the amplitude controller 540 may select a recovery voltage (e.g., 4.0V) for the bit line. The recovery voltage may be a positive voltage or a negative voltage. The magnitude of the recovery voltage may be at least twenty percent larger than a magnitude of the bit line voltage (e.g., 2.0V) for writing data. By applying the recovery voltage to the memory cell 125, stress can be applied to the memory cell 125. Due to the stress applied to the memory cell 125, materials within the memory cell 125 may be configured or oriented in a manner that porous areas within the memory device may be reduced. By reducing porous areas, a resistance of the memory cell 125 can be SET or RESET according to a write pulse.

In one aspect, to withstand the stress applied due to the recovery pulse, sizes of the components of the memory cell 125 may increase. For example, to support or allow additional current to flow, the transistor 210 may have a larger size than other transistors designed for a resistive memory device without the recovery feature disclosed herein. Similarly, to support or allow additional current to flow, metal rails may have larger widths than metal rails designed for a resistive memory device without the recovery feature disclosed herein.

In one approach, the amplitude controller 540 selects the recovery voltage, and the bit line controller 520 can apply a recovery pulse to a memory device as a corrective approach, a preventive approach, or both. As a corrective approach, the memory tester 560 can detect a failed memory cell 125, and the amplitude controller 540 may select a voltage or an amplitude for the repair operation, in response to detecting the failed memory cell 125. The bit line controller 520 may then apply the recovery pulse having the selected voltage or amplitude to the failed memory cell 125. As a preventive approach, the memory cycle counter 550 counts a number of write operations performed on a memory cell 125, and the amplitude controller 540 selects a voltage or an amplitude for the preventive operation, in response to the counted number of write operation reaching a predetermined threshold (e.g., one hundred or one thousand). The bit line controller 520 may then apply the recovery pulse having the selected voltage or amplitude to the memory cell 125. By applying the recovery voltage to a memory device as a corrective approach, a preventive approach, or both, a lifetime of the memory device can be extended.

Figure 6A:
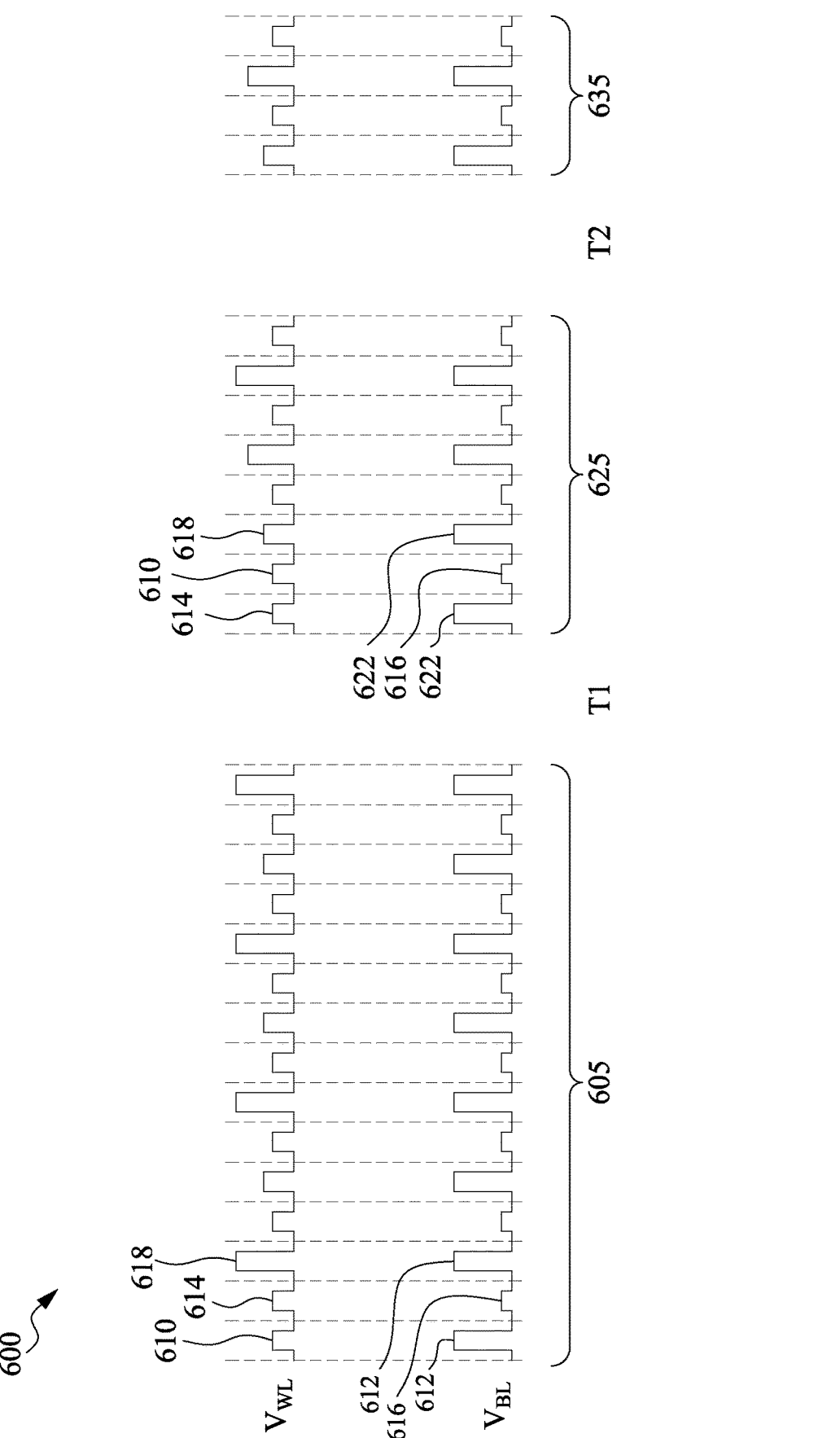
FIG. 6A is a timing diagram showing pulses applied to a memory cell to extend a lifetime of the memory cell, in accordance with some embodiments.

FIG. 6A is a timing diagram 600 showing pulses applied to a memory cell 125 to extend a lifetime of the memory cell 125, in accordance with some embodiments. In the timing diagram 600 shown in FIG. 6A, recovery pulses 622 are applied as a corrective approach to repair a failed memory cell 125. In other embodiments, the pulses are applied in a different manner than shown in FIG. 6A.

In one approach, during a time period 605, the memory cell 125 operates in a normal condition, such that data can be stored by the memory cell 125 by applying various pulses. In one example, the memory controller 105 may apply pulses 610, 614, 618 to a word line coupled to the memory cell 125 and apply pulses 612, 616, 612 to a bit line coupled to the memory cell 125 to write data at the memory cell 125. For example, the memory controller 105 applies the pulse 610 having a first write voltage (e.g., 1.1V) to the word line and applies the pulse 612 having a first bit line voltage (e.g., 2.0V) to the bit line to set a resistance of the memory cell 125 to have a first state. For example, the memory controller 105 applies the pulse 614 having a read voltage (e.g., 1.1V) to the word line and applies the pulse 616 having a second bit line voltage (e.g., 0.1V) to the bit line to read data stored by the memory cell 125. For example, the memory controller 105 applies the pulse 618 having a second write voltage (e.g., 1.8V) to the word line and applies the pulse 612 having the first bit line voltage (e.g., 2.0V) to the bit line to reset the resistance of the memory cell 125 to have a second state.

In one approach, at time T1, the memory controller 105 detects a failure of the memory cell 125. In response to detecting the failed memory cell 125, the memory controller 105 may perform a recovery operation on the failed memory cell 125 during a time period 620. In one approach, the memory controller 105 may apply pulses 614, 610, 618 to the word line and apply pulses 622, 616, 622 to the bit line. For example, the memory controller 105 applies the pulse 614 having the read voltage (e.g., 1.1V) to the word line and applies the pulse 622 having a recovery voltage (e.g., 4.0V) to the bit line. For example, the memory controller 105 applies the pulse 610 having the first write voltage (e.g., 1.1V) to the word line and applies the pulse 616 having the second bit line voltage. For example, the memory controller 105 applies the pulse 618 having the second write voltage (e.g., 1.8V) to the word line and applies the pulse 622 having the recovery voltage (e.g., 4.0V). The memory controller 105 may apply the pulses 622 for a predetermined number of cycles during the time period 625 to repair the failed memory cell 125.

In one approach, at time T2, the memory controller 105 determines that the memory cell 125 is repaired. In response to determining that the memory cell 125 is repaired, the memory controller 105 may write data at the memory cell 125 during the time period 635.

Figure 6B:
FIG. 6B is a timing diagram showing pulses applied to a memory cell to extend a lifetime of the memory cell, in accordance with some embodiments.

FIG. 6B is a timing diagram 660 showing pulses applied to a memory cell 125 to extend a lifetime of the memory cell 125, in accordance with some embodiments. In the timing diagram 660 shown in FIG. 6B, recovery pulses 622 are applied to a memory cell 125 as a preventive approach. In other embodiments, the pulses are applied in a different manner than shown in FIG. 6B.

In one aspect, the memory controller 105 applies the pulses 610, 612, 614, 616, 618, 622 to the memory cell 125 during the time periods 605, 625, 635 in a similar manner as described above with respect to FIG. 6A, except that the memory controller 105 applies the pulses 610, 612, 614, 616, 618 for a predetermined number of cycles during the time period 605 then applies the pulses 610, 614, 618, 622, 616 during the time period 625. Thus, detailed description of duplicated portion thereof is omitted herein for the sake of brevity. In one aspect, the memory controller 105 counts a number of write operations performed on the memory cell 125. In response to the counted number reaching a predetermined threshold (e.g., one thousand) at time T3, the memory controller 105 may apply the recovery pulses 622 to the bit line during the time period 625 as a preventive operation. By applying the recovery pulses 622, the lifetime of the memory cell 125 can be extended. The memory controller 105 may apply the pulses 622 for a predetermined number of cycles (e.g., ten cycles) during the time period 620. At time T4, in response to performing the preventive operation on the memory cell 125 during the time period 625 for the predetermined number of cycles, the memory controller 105 may write data at the memory cell 125 during the time period 635. By performing the preventive operation by periodically applying the recovery pulses 622, the lifetime of the memory cell 125 can be extended.

Figure 7A:
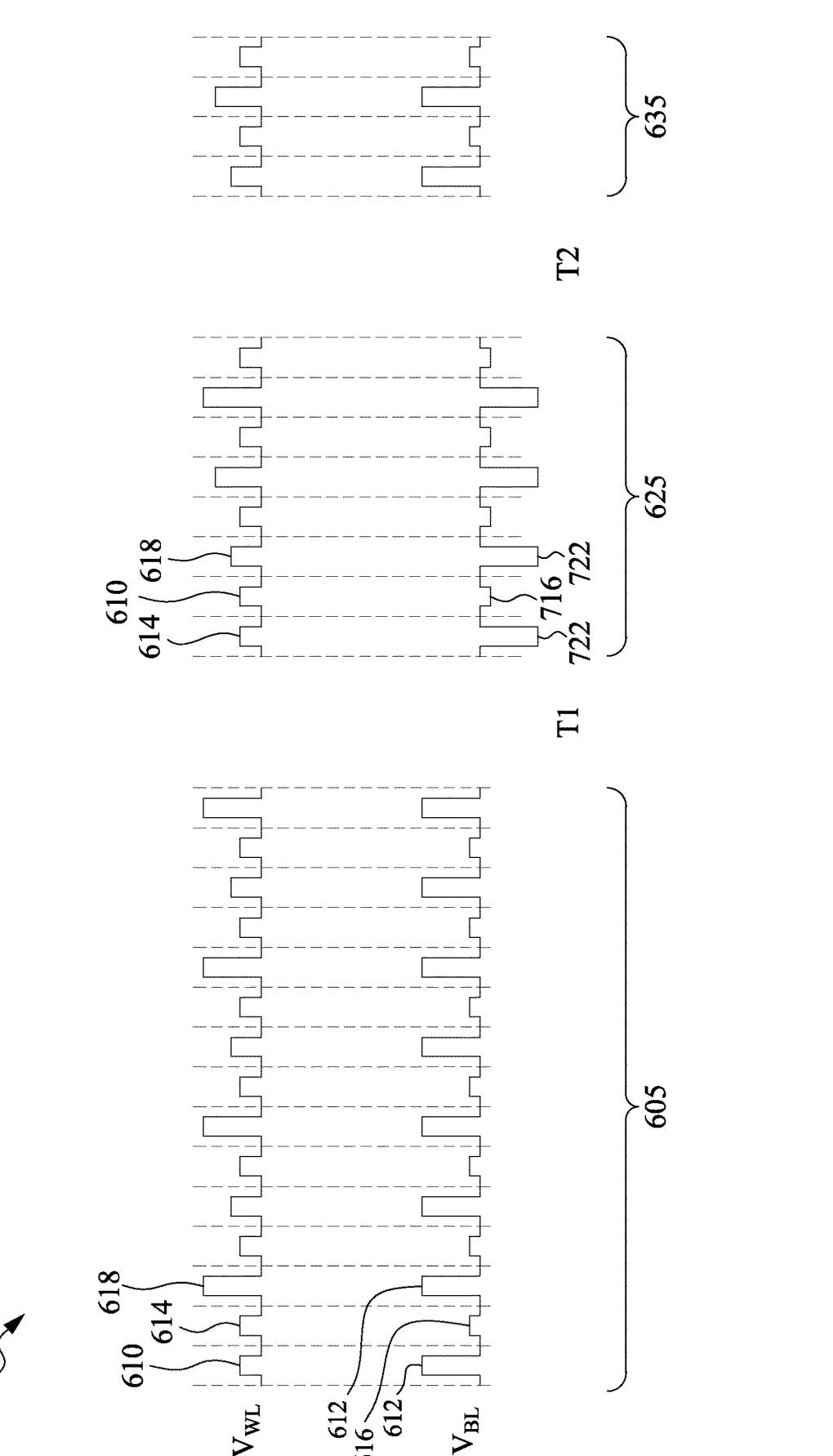
FIG. 7A is a timing diagram showing pulses applied to a memory cell to extend a lifetime of the memory cell, in accordance with some embodiments.

FIG. 7A is a timing diagram 700 showing pulses applied to a memory cell to extend a lifetime of the memory cell 125, in accordance with some embodiments. In the timing diagram 700 shown in FIG. 7A, recovery pulses 722 are applied to a failed memory cell 125 to repair the failed memory cell 125 as a corrective approach. In one aspect, the memory controller 105 applies the pulses 610, 612, 614, 616, 618 to the memory cell 125 during the time periods 605, 635 in a similar manner as described above with respect to FIG. 6A, except that the memory controller 105 applies pulses 722, 716 having negative amplitudes to the bit line during the time period 625. Thus, detailed description of duplicated portion thereof is omitted herein for the sake of brevity. In one aspect, the magnitude of the pulse 722 is at least 20 percent higher than the magnitude of the pulse 612. By applying the pulse 722 with the negative voltage during the time period 625, the failed memory cell 125 can be repaired.

Figure 7B:
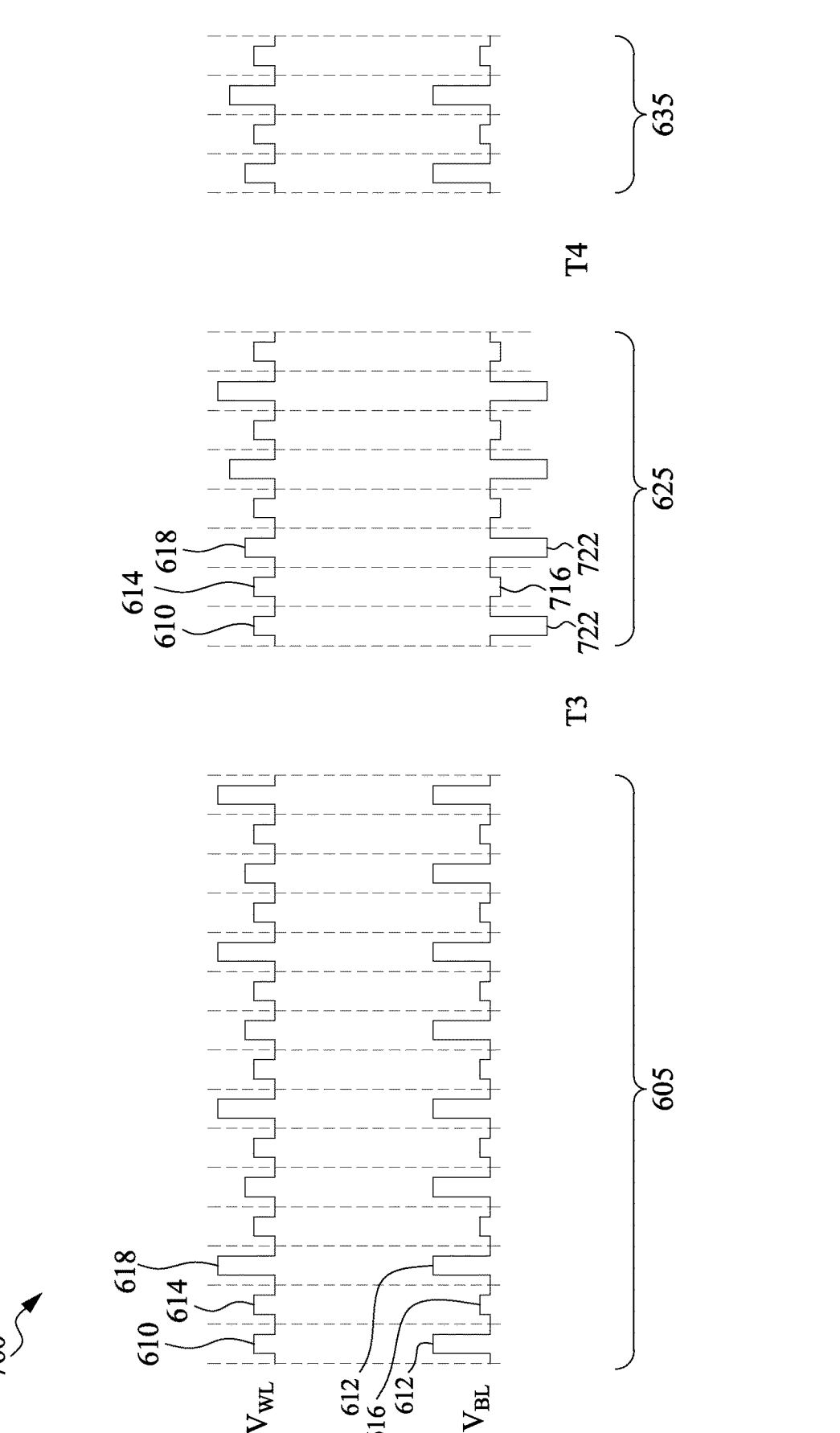
FIG. 7B is a timing diagram showing pulses applied to a memory cell to extend a lifetime of the memory cell, in accordance with some embodiments.

FIG. 7B is a timing diagram 760 showing pulses applied to a memory cell 125 to extend a lifetime of the memory cell 125, in accordance with some embodiments. In the timing diagram 760 shown in FIG. 7B, recovery pulses 722 are applied to a memory cell 125 as a preventive approach. In other embodiments, the pulses are applied in a different manner than shown in FIG. 7B. In one aspect, the memory controller 105 applies the pulses 610, 612, 614, 616, 618 to the memory cell 125 during the time periods 605, 635 in a similar manner as described above with respect to FIG. 6B, except that the memory controller 105 applies pulses 722, 716 having negative amplitudes to the bit line during the time period 625. Thus, detailed description of duplicated portion thereof is omitted herein for the sake of brevity. By applying the pulse 722 with the negative voltage during the time period 625, the lifetime of the memory cell 125 can be extended.

Figure 8:
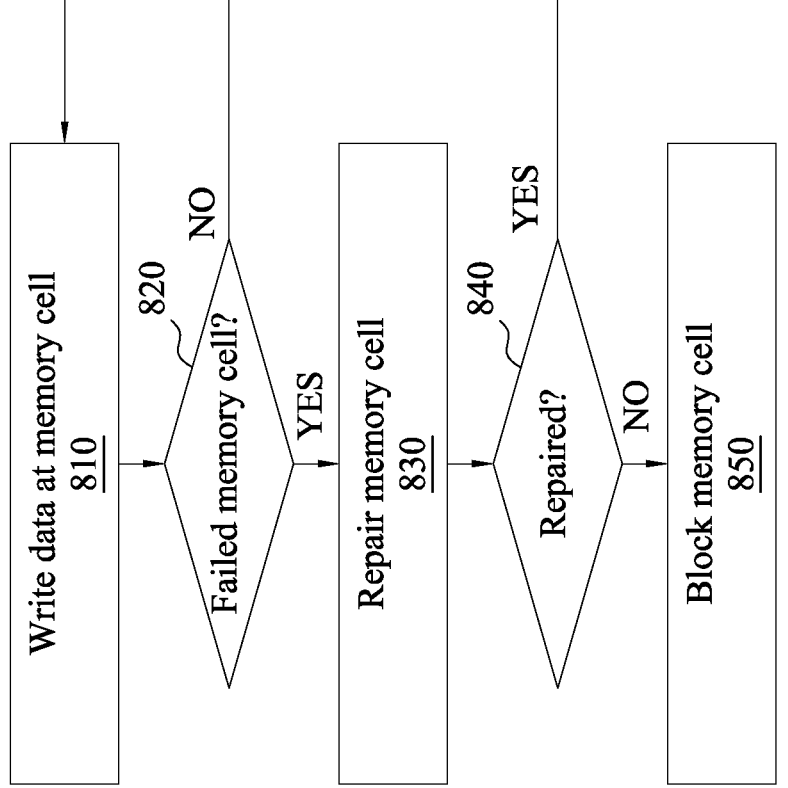
FIG. 8 is a flowchart of a method of extending a lifetime of a memory cell, in accordance with some embodiments.

FIG. 8 is a flowchart of a method 800 of extending a lifetime of a memory cell 125, in accordance with some embodiments. The method 800 may be performed by the memory controller 105 of FIG. 1. In some embodiments, the method 800 is performed by other entities. In one aspect, the memory controller 105 performs a corrective operation to repair a failed memory cell 125. In some embodiments, the method 800 includes more, fewer, or different operations than shown in FIG. 8.

In an operation 810, the memory controller 105 writes data at a memory cell 125. In one approach, the memory controller 105 receives an input data to write, and selects an amplitude of a pulse corresponding to the input data. The memory controller 105 may apply the pulse having the selected amplitude to the memory cell 125. For example, the memory controller 105 applies a first write voltage (e.g., 1.1V) to a word line and applies a first bit line voltage (e.g., 2.0V) to a bit line to set a resistance of the memory cell 125 to have a first state. For example, the memory controller 105 applies a second write voltage (e.g., 1.8V) to the word line and applies the first bit line voltage (e.g., 2.0V) to the bit line to set the resistance of the memory cell 125 to have a second state.

In an operation 820, the memory controller 105 tests the memory cell 125 to detect any failure. The memory controller 105 may test the memory cell 125 after each write operation, or a predetermined number of write operations. To test the memory cell 125, the memory tester 560 may read data stored by the memory cell 125, and compare the input data provided to the word line controller 510 and/or the bit line controller 520 with the data stored by the memory cell 125. In response to determining that the input data being different than the data stored by the memory cell 125, the memory controller 105 may determine that the memory cell 125 has failed. In response to determining that the input data being same as the data stored by the memory cell 125, the memory controller 105 may determine that the memory cell 125 has not failed. If the failure of the memory cell 125 is not detected, the memory controller 105 may proceed to the operation 810 and write data at the memory cell 125. For example, in response to the memory tester 560 determining that the memory cell 125 has not failed, the amplitude controller 540 may select a voltage or an amplitude of a pulse to write the input data to the memory cell 125. Then, the pulse generator 525 may apply pulses having the selected voltage or amplitude to the memory cell 125. For example, the pulse generator 525 may apply 2.0V to a bit line for writing data at the memory cell 125. If the failure of the memory cell 125 is detected, the memory controller 105 may proceed to an operation 830.

In the operation 830, in response to detecting a failure of the memory cell 125, the memory controller 105 may repair the failed memory cell 125. In one approach, the memory controller 105 applies a recovery pulse having an amplitude larger than an amplitude of a pulse for writing data. For example, in response to the memory tester 560 determining that the memory cell 125 has not failed, the amplitude controller 540 selects a voltage or an amplitude of a recovery pulse having a higher voltage or amplitude than the pulse for writing data. Then, the pulse generator 525 may apply pulses having the selected voltage or amplitude to the failed memory cell 125. For example, the pulse generator 525 may apply 4.0V to the bit line for repairing the failed memory cell 125. By applying the recovery pulse having a higher amplitude to the bit line than to the pulse applied to the bit line for writing data, porous areas within the memory cell 125 may be reduced. Accordingly, the memory cell 125 can be repaired and store data.

In the operation 840, the memory controller 105 tests the memory cell 125 to determine whether the memory cell 125 has been repaired. In one approach, the memory controller 105 may perform the operations 810, 820 to determine whether the memory controller 105 can store input data correctly. For example, the memory controller 105 may write test data (or additional input data) at the memory cell 125 and compare the stored data by the memory cell 125 with the test data to determine whether the memory cell 125 can store the test data correctly or not. If the memory controller 105 can store the test data correctly, the memory controller 105 may determine that the memory cell is repaired and proceed to the operation 810 for further use. If the memory controller 105 does not store the correct test data, the memory controller 105 may determine that the memory cell 125 cannot be repaired through the recovery operation and proceed to the operation 850 to block using the memory cell 125.

Figure 9:
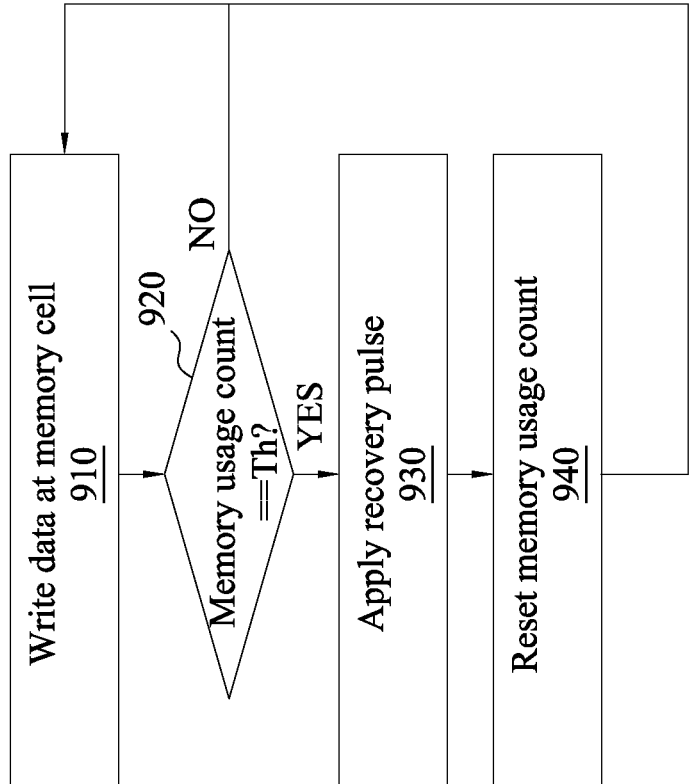
FIG. 9 is a flowchart of a method of extending a lifetime of a memory cell, in accordance with some embodiments.

FIG. 9 is a flowchart of a method 900 of extending a lifetime of a memory cell, in accordance with some embodiments. The method 900 may be performed by the memory controller 105 of FIG. 1. In some embodiments, the method 900 is performed by other entities. In one aspect, the memory controller 105 periodically performs a preventive operation to extend a lifetime of the memory cell 125. In some embodiments, the method 900 includes more, fewer, or different operations than shown in FIG. 9.

In an operation 910, the memory controller 105 writes data at a memory cell 125. In one approach, the memory controller 105 receives an input data to write and selects an amplitude of a pulse corresponding to the input data. The memory controller 105 may apply the pulse having the selected amplitude to the memory cell 125. For example, the memory controller 105 applies a first write voltage (e.g., 1.1V) to a word line and applies a first bit line voltage (e.g., 2.0V) to a bit line to set a resistance of the memory cell 125 to have a first state. For example, the memory controller 105 applies a second write voltage (e.g., 1.8V) to the word line and applies the first bit line voltage (e.g., 2.0V) to the bit line to set the resistance of the memory cell 125 to have a second state.

In an operation 920, the memory controller 105 determines whether a memory usage count has reached a predetermined threshold (e.g., one thousand). For example, the memory cycle counter 550 counts a number of write operations performed on the memory cell 125. If the counted number is less than the predetermined threshold, the memory controller 105 may proceed to the operation 910 and write data at the memory cell 125. For example, in response to the memory cycle counter 550 determining that the counted number is less than the predetermined threshold, the amplitude controller 540 may select a voltage or an amplitude of a pulse to write the input data to the memory cell 125. Then, the pulse generator 525 may apply pulses having the selected voltage or amplitude to the memory cell 125. For example, the pulse generator 525 may apply 2.0V to a bit line for writing data at the memory cell 125. If the counted number is equal to the predetermined threshold, the memory controller 105 may proceed to an operation 930.

In an operation 930, the memory controller 105 applies a recovery pulse to the memory cell 125. The recovery pulse may have a higher amplitude than the pulse applied for writing data. For example, in response to the memory cycle counter 550 determining that the counted number is equal to the predetermined threshold, the amplitude controller 540 may select a voltage or an amplitude of a recovery pulse having a higher voltage or amplitude than the pulse for writing data. Then, the pulse generator 525 may apply pulses having the selected voltage or amplitude to the memory cell 125. For example, the pulse generator 525 may apply 4.0V to the bit line coupled to the memory cell 125. By applying the recovery pulse having a higher amplitude to the bit line than the pulse applied to the bit line for writing data, porous areas within the memory cell 125 may be reduced or reoriented. Accordingly, the lifetime of the memory cell 125 can be extended.

In an operation 940, after applying the recovery pulse, the memory controller 105 resets the memory usage count to an initial value (e.g., '0'). After resetting the memory usage count, the memory controller 105 may proceed to the operation 910, and write data at the memory cell 125.

Figure 10B:
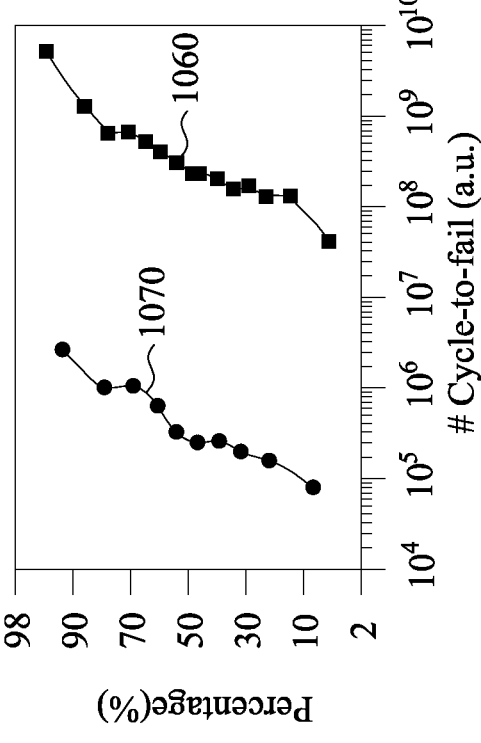
FIG. 10B is a plot showing a comparison of a number of cycles to failure of a resistive memory device before performing a recovery operation and a number of cycles to failure of the resistive memory device after performing the recovery operation, in accordance with some embodiments.
Figure 10A:
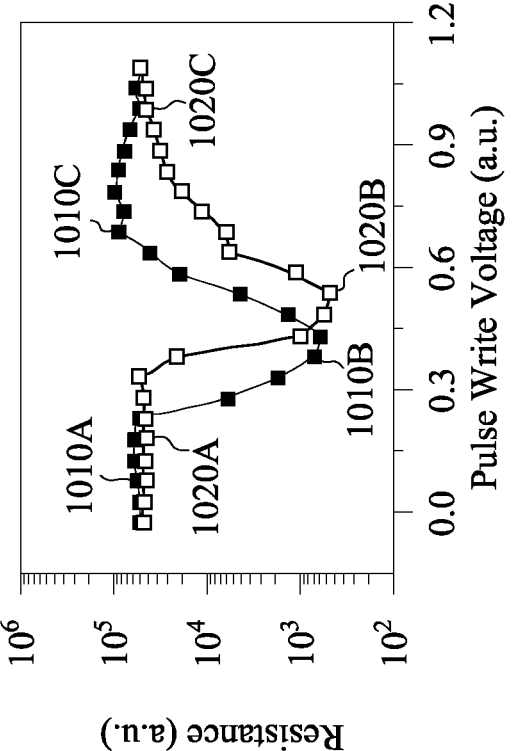
FIG. 10A is a plot showing a comparison of a resistance of a resistive memory device before performing a recovery operation and a resistance of the resistive memory device after performing the recovery operation, in accordance with some embodiments.

FIG. 10A is a plot 1000 showing a comparison of a resistance of a phase change memory device before performing a recovery operation and a resistance of the phase change memory device after performing the recovery operation, in accordance with some embodiments. In one aspect, a phase change memory device operating without a failure has a first resistance 1010A in response to a first voltage (e.g., 0~0.25V), has a second resistance 1010B in response to a second voltage (e.g., 0.3~0.5V), has a third resistance 1010C in response to a third voltage (e.g., 0.9~1.2V). After the phase change memory device fails, a resistance of the phase change memory device may not change according to the first voltage, the second voltage, or the third voltage applied. By performing a recovery operation on a failed memory cell 125, the memory cell 125 may respond to a voltage applied and have resistances 1020A, 1020B, 1020C that are similar to the resistances 1010A, 1010B, 1010C. In one aspect, the resistance curve may shift after performing the recovery operation. Hence, to write data at a memory cell 125 after performing the recovery operation, the pulse generator 525 or the pulse generator 515 may apply a higher voltage than a voltage applied for the memory device 125 before the recovery operation is performed.

FIG. 10B is a plot 1050 showing a comparison of a number of cycles to failure of a resistive memory device before performing a recovery operation and a number of cycles to failure of the resistive memory device after performing the recovery operation, in accordance with some embodiments. In one aspect, a phase change memory device may fail roughly after one hundred million write operation cycles to a billion write operation cycles are performed as shown in a curve 1060. After performing the recovery operation, the repaired resistive memory device can be functional, until roughly additional one hundred thousand write operation cycles to one million write operation cycles are performed as shown in the curve 1070. Hence, the lifetime of the resistive memory device can be extended by performing a recovery operation as disclosed herein.

Figure 11:
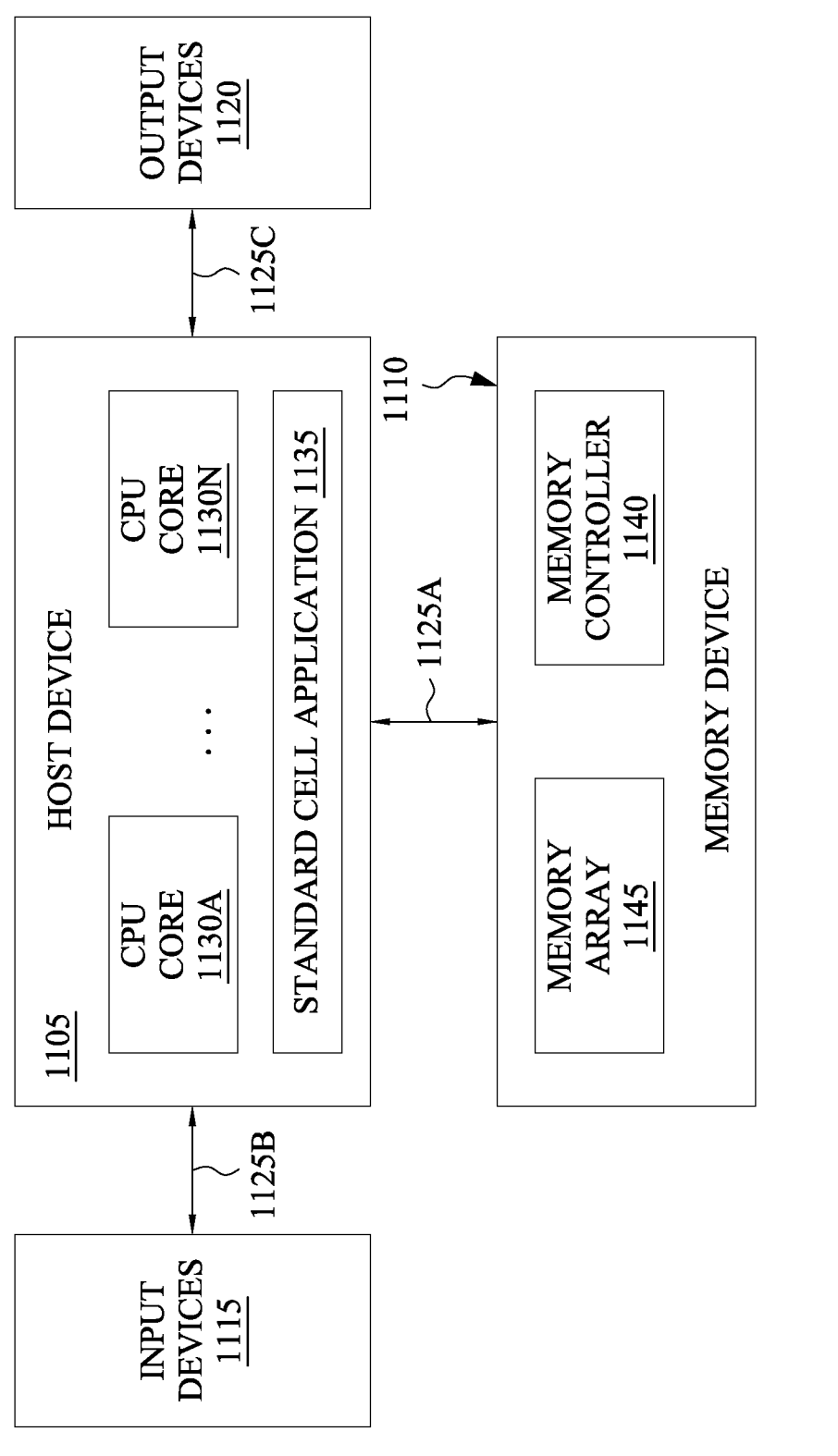
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update, or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 11, the memory device 1110 includes a memory controller 1140 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, SRAM cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11. However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to a memory system. In some embodiments, the memory system includes a memory cell and a memory controller coupled to the memory cell. In some embodiments, the memory controller is to apply a first voltage to the memory cell to write input data to the memory cell and apply a second voltage larger than the first voltage to the memory cell to extend a lifetime of the memory cell. In some embodiments, the memory cell includes a resistive memory device. A resistance of the resistive memory device may be corrected in response to the second voltage larger than the first voltage. In some embodiments, the resistive memory device includes a phase change random access memory device.

One aspect of this description relates to a method of extending a lifetime of a memory cell. In some embodiments, the method includes detecting, by the memory controller, whether the memory cell has failed or not. In some embodiments, the method includes repairing, by the memory controller, the memory cell by applying a first pulse having a first amplitude to the memory cell, in response to determining that the memory cell has failed. In some embodiments, the method includes writing, by the memory controller, input data to the memory cell by applying a second pulse having a second amplitude less than the first amplitude, in response to repairing the memory cell. In some embodiments, the memory cell includes a resistive memory device. A resistance of the resistive memory device may be corrected in response to the first pulse having the first amplitude larger than the second amplitude. In some embodiments, the resistive memory device includes a phase change random access memory device.

One aspect of this description relates to a memory controller. In some embodiments, the memory controller includes an amplitude controller to select a first amplitude to write input data at a memory cell and select a second amplitude to extend a lifetime of the memory cell. In some embodiments, the memory controller includes a pulse generator coupled to the amplitude controller. In some embodiments, the pulse generator is to apply a pulse having one of the first amplitude or the second amplitude selected by the amplitude controller to the memory cell. In some embodiments, the memory cell includes a phase change random access memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

detecting, by a memory controller, whether a memory cell has failed or not, wherein the detecting comprises:

writing, by the memory controller, additional input data to the memory cell;

reading, by the memory controller, data stored by the memory cell;

comparing, by the memory controller, the data stored by the memory cell with the additional input data; and determining whether the memory cell has failed according to the comparison;

repairing, by the memory controller, the memory cell by applying a first pulse having a first amplitude to the memory cell, in response to determining that the memory cell has failed; and writing, by the memory controller, input data to the memory cell by applying a second pulse having a second amplitude less than the first amplitude, in response to repairing the memory cell.

2. The method of claim 1, further comprising:

writing, by the memory controller, the input data to the memory cell by applying a third pulse having a third amplitude less than the first amplitude, in response to determining that the memory cell has not failed.

3. The method of claim 2, wherein the third amplitude is less than the second amplitude.

4. The method of claim 1, wherein the memory cell includes a resistive memory device, wherein a resistance of the resistive memory device is corrected in response to the first pulse having the first amplitude larger than the second amplitude.

5. The method of claim 4, wherein the resistive memory device includes a phase change random access memory cell device.

6. A memory system comprising:

a memory controller coupled to a memory cell and configured to:

apply a first voltage to the memory cell to write input data thereto, and apply a second voltage larger than the first voltage to the memory cell to extend a lifetime thereof, wherein the memory controller includes:

an amplitude controller configured to:

select the first voltage to write the input data to the memory cell, in response to a first detecting that the memory cell has not failed, select the second voltage to repair the memory cell, in response to a second detecting that the memory cell has failed, select a third voltage less than the second voltage to write additional input data to the memory cell after repairing the memory cell.

7. The memory system of claim 6, wherein the memory controller further includes:

a memory tester coupled to the memory cell to detect a failure of the memory cell.

8. The memory system of claim 7, wherein the memory tester is configured to:

read data stored by the memory cell, compare the data stored by the memory cell with the input data, and determine whether the memory cell has failed according to the comparison.

9. The memory system of claim 6, wherein the third voltage is larger than the first voltage.

10. The memory system of claim 6, wherein the memory cell includes a resistive memory device, wherein a resistance of the resistive memory device is corrected in response to the second voltage larger than the first voltage.

11. The memory system of claim 10, wherein the resistive memory device is a phase change random access memory device.

12. The memory system of claim 10, wherein the resistive memory device is a Magnetoresistive random-access memory (MRAM).

13. The memory system of claim 6, wherein the memory controller further includes:

a memory cycle counter coupled to the memory cell and configured to count a number of write operation cycles of the memory cell.

14. The memory system of claim 13, wherein the amplitude controller is also configured to:

select the first voltage to write the input data to the memory cell, in response to the number of write operation cycles being less than a predetermined threshold, and select the second voltage to extend the lifetime of the memory cell, in response to the number of write operation cycles being larger than the predetermined threshold.

15. The memory system of claim 13, wherein the memory cycle counter is to reset the number of write operation cycles in response to applying the second voltage to the memory cell.

16. A memory controller comprising:

an amplitude controller configured to:

select a first amplitude to write input data at a memory cell, select a second amplitude to extend a lifetime of the memory cell, wherein a pulse having one of the first amplitude or the second amplitude selected by the amplitude controller is applied by a pulse generator to the memory cell, and wherein the pulse generator is coupled to the amplitude controller, select the first amplitude to write the input data at the memory cell, in response to a first determining that the memory cell has not failed, select the second amplitude to repair the memory cell, in response to a second determining that the memory cell has failed, and select a third amplitude less than the second amplitude to write additional input data to the memory cell after repairing the memory cell.

17. The memory controller of claim 16, wherein the first amplitude has a positive voltage and the second amplitude has a negative voltage.

18. The memory controller of claim 16, further comprising:

a memory tester coupled to the memory cell and configured to detect a failure of the memory cell.

19. The memory controller of claim 16, wherein the memory cell includes a phase change random access memory device.

20. The memory controller of claim 16, wherein a magnitude of the second amplitude is higher than a magnitude of the first amplitude.

\* \* \* \* \*